United States Patent [19]
Kirchberg et al.

[11] Patent Number: 5,559,689
[45] Date of Patent: Sep. 24, 1996

[54] HARMONIC CONTENT DETERMINATION APPARATUS

[75] Inventors: Maurice Kirchberg, Dubuque, Iowa; Alec Cook, Belvidere, Ill.

[73] Assignee: Sundstrand Corporation, Rockford, Ill.

[21] Appl. No.: 287,326

[22] Filed: Aug. 8, 1994

[51] Int. Cl.[6] .......................... H02M 7/48; H02M 1/12; H02M 5/458
[52] U.S. Cl. ................. 363/95; 363/96; 363/98; 363/41; 363/132
[58] Field of Search .......................... 363/37, 41, 78, 363/79, 95, 98, 132, 137; 364/483, 726; 318/800, 801, 802, 811

[56] References Cited

U.S. PATENT DOCUMENTS

| | | | |
|---|---|---|---|
| 4,961,130 | 10/1990 | Kirchberg, Jr. | 363/41 |
| 4,977,492 | 12/1990 | Kirchberg, Jr. et al. | 363/41 |
| 4,994,956 | 2/1991 | Kirchberg, Jr. et al. | 363/95 |
| 5,001,622 | 3/1991 | Kirchberg, Jr. et al. | 363/95 |
| 5,034,876 | 7/1991 | Kirchberg, Jr. et al. | 363/97 |
| 5,043,857 | 8/1991 | Kirchberg, Jr. et al. | 363/41 |
| 5,053,939 | 10/1991 | Kirchberg, Jr. et al. | 363/41 |

*Primary Examiner*—Peter S. Wong
*Assistant Examiner*—Aditya Krishnan
*Attorney, Agent, or Firm*—Sundstrand Corporation

[57] ABSTRACT

An apparatus for determining a frequency component of a signal exploits the aliasing effect by sampling the signal at the frequency of the component (or an integer multiple thereof) to produce first and second sets of samples at the sampling frequency. Corresponding samples of the first and second sets of samples are separated in phase by substantially 90°. The apparatus vectorially determines the magnitude and phase of the frequency component of the signal from the first and second sets of samples.

26 Claims, 4 Drawing Sheets

HARMONIC CONTENT DETERMINATION APPARATUS

TECHNICAL FIELD OF THE INVENTION

The present invention relates to the detection of harmonics in a signal and, more particularly, to the detection of harmonics in an inverter signal and to the operation of the inverter so as to control those harmonics in an output of the inverter.

BACKGROUND OF THE INVENTION

The determination of the frequency components of a signal is important in many applications. For example, in an inverter which inverts DC power into AC power, it is typical practice to sense the frequency components of the inverter output in order to operate the inverter so as to control those frequency components. Specifically, it is typical practice to control the first harmonic, i.e. that frequency component having a frequency equal to the fundamental frequency of the inverter output, at a predetermined magnitude and phase, and to control as many of the other harmonic components as is practical so that they are suppressed in the inverter output.

An inverter is often used in a power conversion system, such as a variable speed, constant frequency (VSCF) power generating system. In a variable speed, constant frequency power generating system, a generator, typically a brushless, three-phase synchronous generator, is operated in a generating mode to convert variable speed motive power supplied by a prime mover into variable frequency AC power. The prime mover may be, for example, a gas turbine engine of an aircraft. The variable frequency AC power produced by the generator is rectified and provided as a DC signal over a DC link to an inverter.

The inverter inverts the DC signal on the DC link into a constant frequency AC inverter output for supply over a load bus to one or more AC loads. The inverter is controlled so that its constant frequency AC output has a desired fundamental frequency. However, the inverter output normally also includes a plurality of harmonics of the fundamental frequency; that is, each such harmonic has a frequency which is an integer multiple of the inverter output fundamental frequency.

Because such harmonics in an inverter output are, generally, undesirable, the inverter is normally controlled so that harmonics of the inverter output fundamental frequency are suppressed or eliminated. In order to control an inverter so as to suppress or eliminate these harmonics, the inverter output is analyzed, normally by a Fourier analysis, in order to determine the harmonic content therein, and the inverter is controlled in response to that harmonic content.

That is, a periodic signal can be represented by an infinite series of trigonometric terms according to the following equation:

$$f(t) = a_o + a_n \cos(n\omega t) + b_n \sin(n\omega t) \quad (1)$$

where $f(t)$ is the periodic signal having a fundamental frequency $f$, $a_o$ is the average, i.e. DC, value of the periodic signal $f(t)$, $a_n$ is the magnitude of the corresponding cosine component $\cos(n\omega t)$, $b_n$ is the magnitude of the corresponding sine component $\sin(n\omega t)$, $n=1, 2, 3, 4, 5, \ldots$ and is the harmonic number specifying each of the frequencies in the periodic signal $f(t)$ (the fundamental frequency is considered to be the first harmonic, i.e. $n=1$), and $\omega$ (i.e., $2\pi f$) is the fundamental angular frequency at the fundamental frequency $f$. The values for $a_n$ and $b_n$ in equation (1) are typically determined by a Fourier analysis. This analysis involves multiplying the signal $f(t)$ by a cosine function (i.e., $\cos(n\omega t)$) having a frequency determined by the harmonic number $n$ and integrating the result over one period of the signal $f(t)$ to determine $a_n$. Similarly, $b_n$ in equation (1) is determined by multiplying the signal $f(t)$ by a sine function (i.e., $\sin(n\omega t)$) having a frequency determined by the harmonic number $n$ and integrating the result over one period of the signal $f(t)$. By setting $n=1, 2, 3, 4, 5 \ldots$, the values of $a_n$ and $b_n$ at the fundamental frequency and each of its harmonics can thus be determined.

Each harmonic can be further specified, if desired, by determining its magnitude and phase. The magnitude of a harmonic is simply the square root of the sum of the squares of its corresponding a and b values. Thus, the magnitude of harmonic n can be determined according to the following equation:

$$mag_n = \sqrt{a_n^2 + b_n^2} \quad (2)$$

where $mag_n$ is the magnitude of harmonic n, $a_n$ is the a value in equation (1) for the harmonic n, and $b_n$ is the b value in equation (1) for the harmonic n. The phase of that harmonic is determined by the arc tangent of its corresponding b value divided by its corresponding a value. Thus, the phase of the harmonic n can be determined by the following equation:

$$pha_n = \tan^{-1} \frac{b_n}{a_n} \quad (3)$$

where $pha_n$ is the phase of harmonic n, $a_n$ is the a value in equation (1) for the harmonic n, and $b_n$ is the b value in equation (1) for the harmonic n.

The approach of integrating $f(t)\sin(n\omega t)$ and $f(t)\cos(n\omega t)$, however, involves a great number of calculations and, therefore, requires a substantial amount of processing time to implement. A faster Fourier analysis can be made by performing a Discrete Fourier Transform, and its even faster form, the Fast Fourier Transform. In performing a Discrete Fourier Transform, a signal is sampled (i.e., tested for magnitude) at a sampling frequency. The samples are then used to determine the set of Fourier coefficients which define the fundamental and harmonic components of the signal being analyzed. In order to avoid aliasing error, the sampling frequency, i.e. the frequency at which the samples are taken, must be greater than the highest frequency of the harmonic components to be determined. This aliasing error generally increases as the sampling frequency decreases toward the frequency of the harmonic component to be determined. For example, if the sampling frequency is exactly equal to the frequency of the harmonic component to be determined, that harmonic component appears as a DC signal since it is being sampled at exactly the same phase in each of its cycles, and the aliasing error is consequently very large. Normally, the sampling frequency is at least twice the frequency of the harmonic component to be determined, but it is usually much higher. Because the sampling frequency needs to be large compared to the harmonic of interest in order to avoid aliasing errors, the amount of processing time required to determine the harmonics (including the fundament frequency and other harmonics) in the analyzed signal is consequently large.

SUMMARY OF THE INVENTION

The present invention, instead of avoiding the aliasing effect, exploits it in order to determine the harmonics in a signal. Therefore, in accordance with one aspect of this invention, an apparatus for determining a frequency component of a signal includes a sampling means for sampling the signal at a sampling frequency. The sampling means produces first and second sets of samples at the sampling frequency. Corresponding samples of the first and second sets of samples are separated in phase by substantially 90°. The apparatus also includes a frequency component determining means for determining the frequency component of the signal from the first and second sets of samples.

In accordance with a further aspect of the invention, an apparatus determines a first harmonic component of a signal, wherein the first signal has a fundamental frequency f, wherein the first harmonic component has a frequency $n_1 f$, wherein $n_1$ is an integer, wherein the signal has a second harmonic component, wherein the second harmonic component has a frequency $n_2 f$, and wherein $n_2$ is an integer multiple of $n_1$. The apparatus includes a sampling means for sampling the signal at a sampling frequency $n_3 f$, wherein the sampling means produces first and second sets of samples at the sampling frequency $n_3 f$, wherein $n_3$ is an integer multiple of $n_1$, and wherein corresponding samples in the first and second sets of samples are separated in phase by substantially 90°. The apparatus further includes a harmonic component determining means for determining the harmonic component from the first and second sets of samples.

According to another aspect of the invention, an inverter system includes an inverter having a DC receiving means for receiving input DC power and AC providing means for providing output AC power having a fundamental frequency f. The inverter system also includes a harmonic determining means connected to the inverter for sampling a signal of the inverter at a sampling frequency $n_2 f$ to produce first and second sets of samples and for determining a harmonic of the fundamental frequency f from the first and second sets of samples, wherein the harmonic has a frequency $n_1 f$, wherein corresponding samples in the first and second sets of samples are separated in phase by substantially 90°, wherein $n_2$ is an integer greater than $n_1$, and wherein the frequency $n_2 f$ is another harmonic of the fundamental frequency f. A controlling means of the inverter system is connected to the inverter and to the harmonic determining means for controlling the inverter so as to suppress the harmonic having the frequency $n_1 f$.

According to yet a further aspect of the invention, an inverter system includes an inverter having a DC receiving means for receiving input DC power and an AC providing means for providing output AC power having a fundamental frequency f. A harmonic determining means of the inverter system is connected to the inverter for sampling a signal of the inverter at a sampling frequency to produce first and second sets of samples and for determining a harmonic of the fundamental frequency f from the first and second sets of samples, wherein the harmonic has a frequency $n_1 f$. A controlling means of the inverter system is connected to the inverter and to the harmonic determining means for controlling the inverter so as to substantially eliminate, from the output AC power, the harmonic having the frequency $n_1 f$.

According to yet a further aspect of the invention, a method for determining a component in a signal, wherein the signal has a fundamental frequency f, and wherein the component has a frequency $n_1 f$ which is substantially an integer multiple of the fundamental frequency f, includes the following steps: sampling the signal at a sampling frequency to produce first and second sets of samples, wherein corresponding samples in the first and second sets of samples are separated in phase by substantially 90°; and, determining the component from the first and second sets of samples.

BRIEF DESCRIPTION OF THE DRAWING

These and other features and advantages will become more apparent from a detailed consideration of the invention when taken in conjunction with the drawing in which.

DETAILED DESCRIPTION

Figure 1:
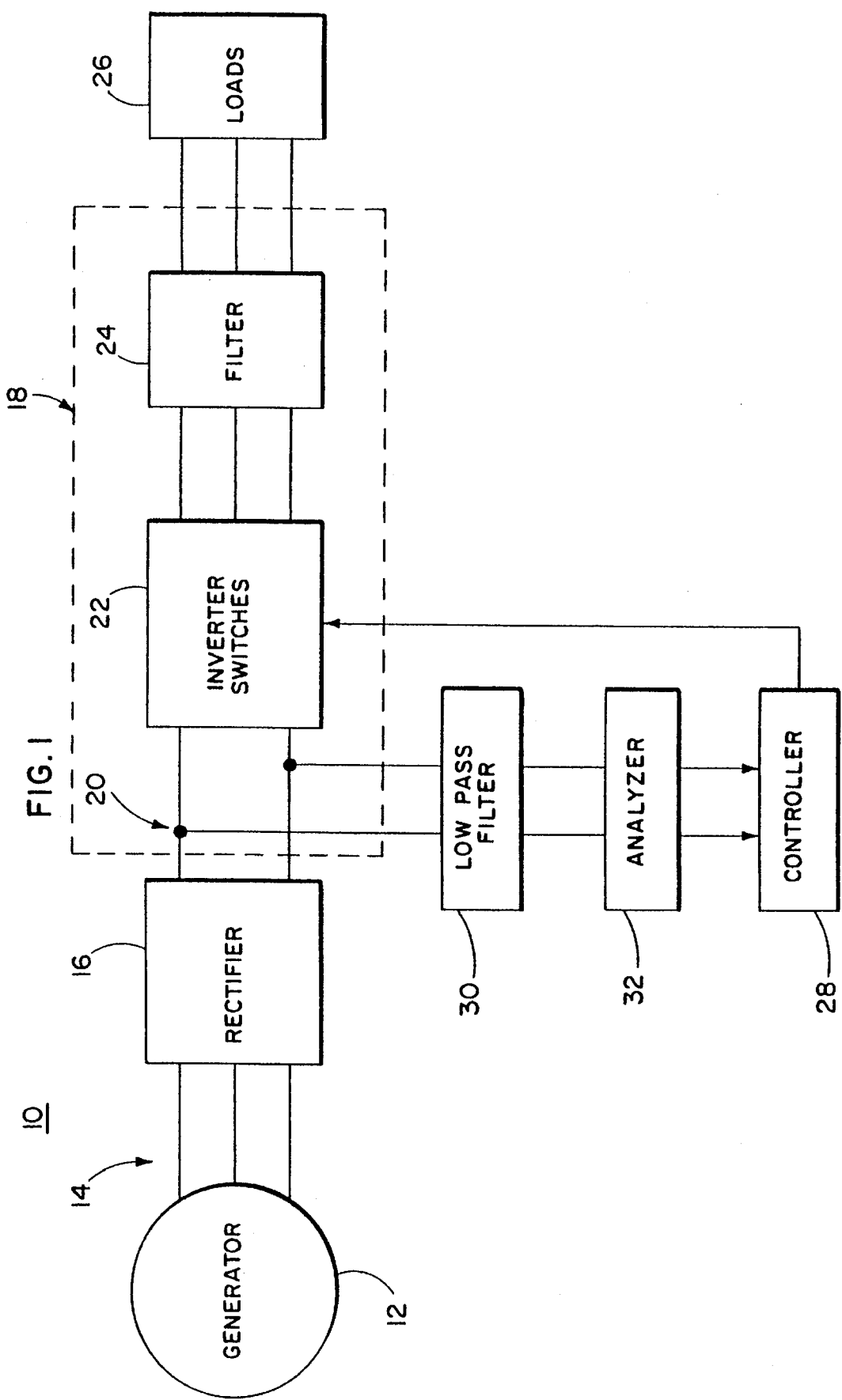
FIG. 1 is a block diagram showing one embodiment of the present invention.

In FIG. 1, an inverter system 10 includes a generator 12 which may be, for example, driven by a variable speed prime mover such as the turbine engine of an aircraft. The generator 12 has a three phase output 14 which, if the generator 12 is driven by a variable speed prime mover, carries wild frequency AC power. A rectifier 16 rectifies the wild frequency AC power on the three phase output 14 of the generator 12 into DC power and supplies this DC power to an inverter 18.

The inverter 18 includes a DC link 20 which receives the DC power from the output of the rectifier 16. Inverter switches 22 of the inverter 18 switch the DC power on the DC link 20 in order to produce AC power. Typically, the inverter switches 22 are controlled in a manner to chop the DC power on the DC link 20 into pulse width modulated pulses which are filtered by a filter 24 to produce three phase, sinusoidal AC power for supply to AC loads 26. The filter 24 is normally arranged to eliminate higher order harmonics in the three phase AC power provided by the inverter 22. Since filters capable of filtering the lower order harmonics (e.g., the third and the fifth harmonics) are massive and expensive, the inverter switches 22 are typically controlled in such a fashion that they suppress those lower order harmonics other than the first harmonic.

The inverter switches 22 are controlled by a controller 28. Harmonics in an inverter signal, i.e. those frequencies which are integer multiples (e.g., 1, 2, 3, 4, 5, . . . ) of the fundamental frequency of the inverter 18, are sensed by a bandpass filter 30 and an analyzer 32. As shown in FIG. 1, the inverter signal is the DC power on the DC link 20 which contains, not only the DC from the rectifier 16, but also any harmonics of the inverter fundamental frequency which feed back through the inverter switches 22 from the output of the inverter 18 to the DC link 20. Accordingly, the bandpass filter 30 is connected to the DC link 20.

The lower cutoff frequency of the bandpass filter 30 is selected to eliminate the DC component on the DC link from the output of the bandpass filter 30. The upper cutoff frequency of the bandpass filter 30 depends upon the harmonics to be controlled by the controller 28. For example, if the filter 34 eliminates all harmonics above the 50$^{th}$ harmonic, the inverter controller 28 controls the inverter switches 22 so as to control all harmonics in the output of the inverter 18 up to and including the 50$^{th}$ harmonic. Thus, the bandpass filter 30 must pass all harmonics up to and including the 50$^{th}$ harmonic to the controller 28. These, controlled harmonics of the inverter fundamental frequency are supplied by the bandpass filter 30 to the analyzer 32. The analyzer 32 determines the magnitudes and phases of the harmonics of the inverter fundamental frequency which are present on the DC link 20. With this arrangement, the harmonics in the output of the inverter 18 are controlled based upon the harmonics on the DC link 20.

Figure 2:
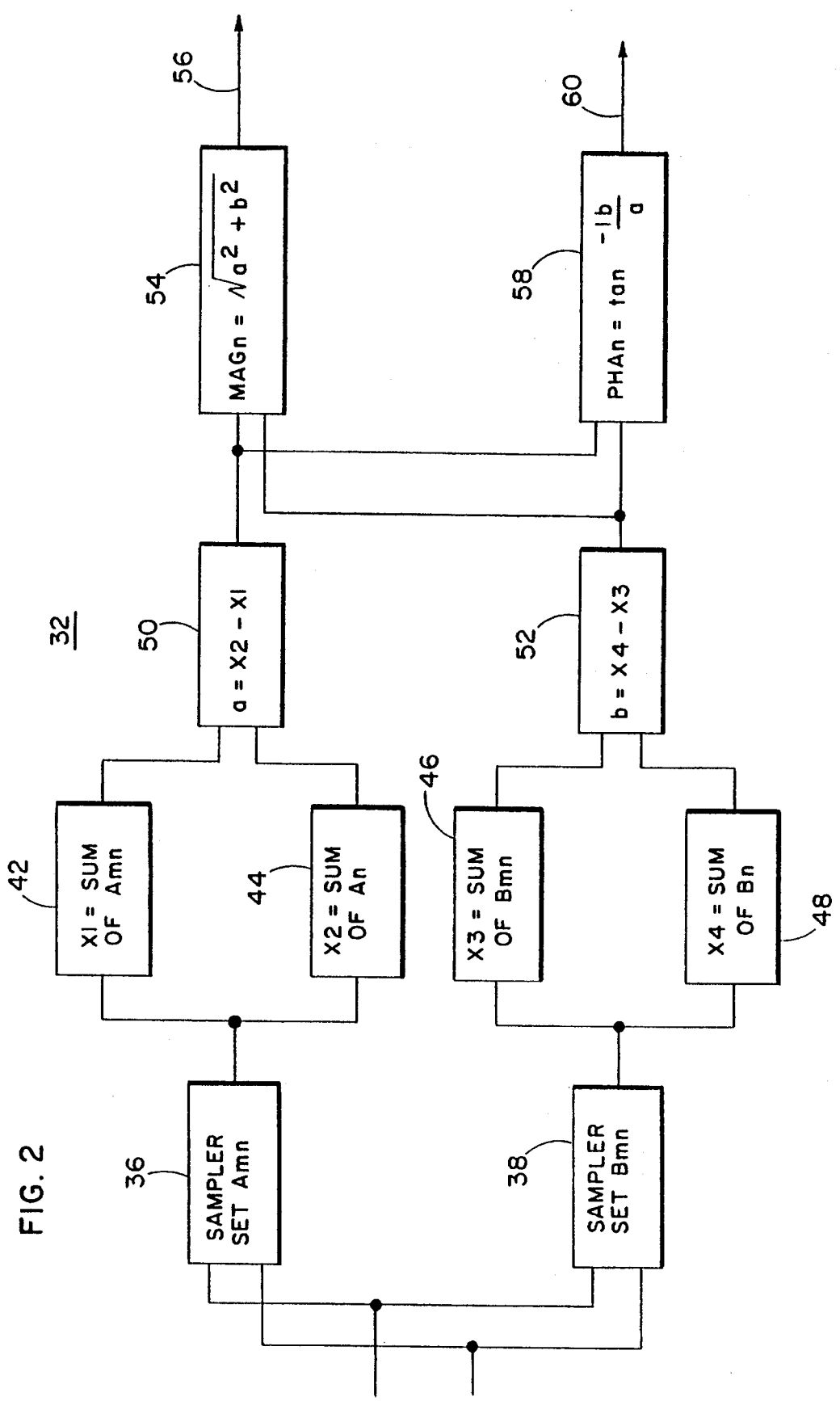
FIG. 2 is a block diagram illustrating one embodiment of the analyzer shown in FIG. 1.

One embodiment of the analyzer 32 is shown in more detail in FIG. 2. As shown in FIG. 2, the analyzer 32 includes a first sampler 36 which samples the output of the bandpass filter 30 at a sampling frequency to produce a first sample set $A_{mn}$. A second sampler 38 samples the output of the bandpass filter 30 at the same sampling frequency to produce a second sample set $B_{mn}$. The samples in the second sample set $B_{mn}$ are displaced in phase by 90° from corresponding samples in the first sample set $A_{mn}$. The harmonic components in the DC signal on the DC link 20 can be determined from these two sample sets.

Figure 3:
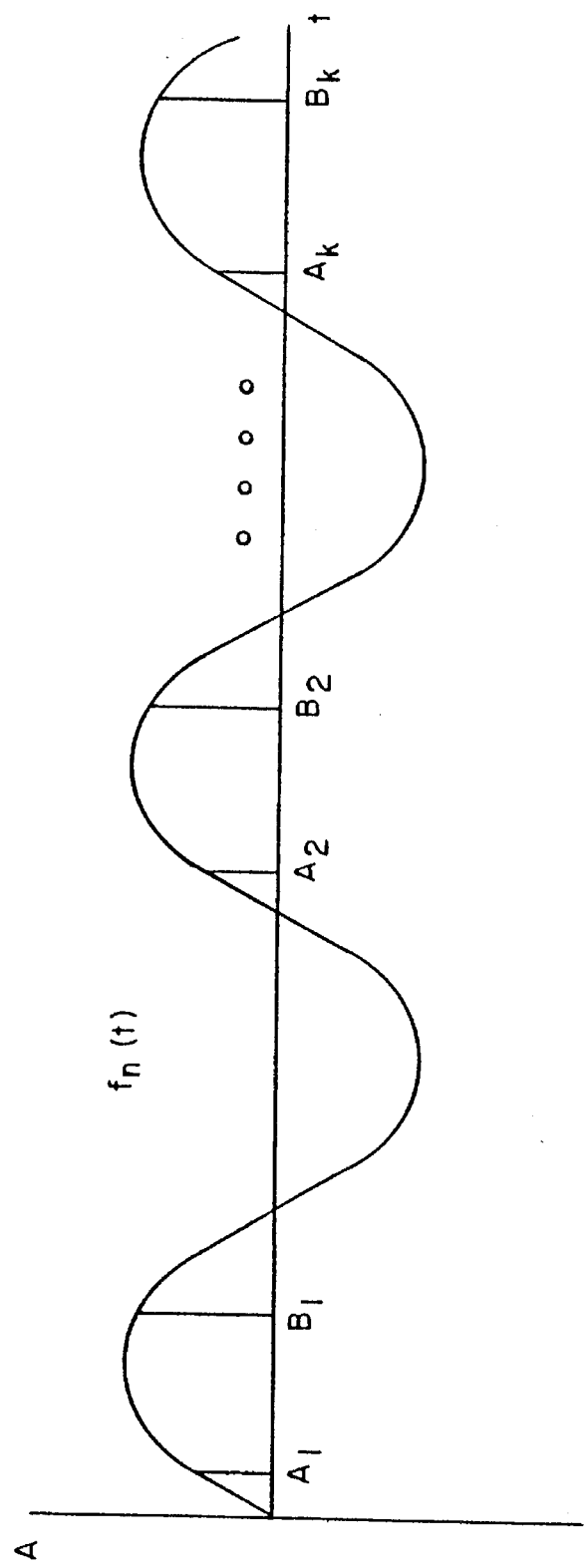
FIG. 3 is a graph illustrating the sampling according to the present invention.

The phase relationship between corresponding samples in the first and second sample sets $A_{mn}$ and $B_{mn}$ can be seen more clearly from FIG. 3. In the output of the bandpass filter 30 are the harmonics of interest one of which, i.e. the signal $f_n(t)$, is shown in FIG. 3. The sampling frequency for the signal $f_n(t)$ is mnf where f is the fundamental frequency of the output of the inverter 18, n is the harmonic number of the signal $f_n(t)$, nf is the frequency of the signal $f_n(t)$, and m is an integer which is selected according to the desired sampling frequency. The first sampler 36 of the analyzer 32 produces the first sample set $A_{mn}$, which includes the samples $A_1, A_2, \ldots, A_k$. The second sampler 38 of the analyzer 32 produces the second sample set $B_{mn}$, which includes the samples $B_1, B_2, \ldots, B_k$. Although the samples in the first sample set $A_{mn}$ may be taken at any phase of the signal $f_n(t)$, the samples in the second sample set $B_{mn}$ are taken so that each sample $B_k$ is separated in phase by 90° from its corresponding sample $A_k$. Thus, as shown in FIG. 3, the sample $B_1$ occurs 90° in phase after its corresponding sample $A_1$, the sample $B_2$ occurs 90° in phase after its corresponding sample $A_2, \ldots$, and the sample $B_k$ occurs 90° in phase after its corresponding sample $A_k$.

The samples in the first and second sample sets $A_{mn}$ and $B_{mn}$ are used to determine the magnitude and phase of the signal $f_n(t)$ by vector analysis. Thus, if m=1, the sampling frequency nf is the frequency nf of the harmonic n and the magnitude of the signal $f_n(t)$ can be determined by the following equation:

$$mag_n = \sqrt{a^2 + b^2} \quad (4)$$

where $mag_n$ is the magnitude of the signal $f_n(t)$, a is the sum of all of the samples $A_k$ in the first sample set $A_{mn}$, b is the sum of all of the samples $B_k$ in the second sample set $B_{mn}$, and k=1, 2, 3 ... k. Similarly, the phase of the signal $f_n(t)$ can be determined by the following equation:

$$pha_n = \tan^{-1} \frac{b}{a} \quad (5)$$

where $pha_n$ is the phase of the signal $f_n(t)$, a is the sum of all of the samples $A_k$ in the first sample set $A_{mn}$, b is the sum of all of the samples $B_k$ in the second sample set $B_{mn}$, and k=1, 2, 3 ... k. Alternatively, a and b in equations (4) and (5) may be computed as the averages of the samples in the corresponding sample sets $A_{mn}$ and $B_{mn}$. Using the averages of the samples in the corresponding sets $A_{mn}$ and $B_{mn}$ normalizes the quantity $mag_n$.

Since the controller 28 controls the inverter 22 at a known fundamental frequency, any harmonics which may appear at the input of the inverter 18 also have known frequencies. Such harmonics may be caused, for example, by operation of the inverter 18. Thus, the output of the bandpass filter 30 is sampled at each of the frequencies of the harmonics to be suppressed. If it is desired to suppress the 13$^{th}$ harmonic of the inverter fundamental frequency, for example, the output of the bandpass filter 30 is also sampled at a sampling frequency equal to the frequency of the 13$^{th}$ harmonic. If it is also desired to suppress the 15$^{th}$ harmonic of the inverter fundamental frequency, the output of the bandpass filter 30 is sampled at a sampling frequency equal to the frequency of the 15$^{th}$ harmonic. These corresponding sample sets are then used in the above equations to determine the magnitude and phase of each of the harmonics of interest, i.e. of the 13$^{th}$ harmonic and the 15$^{th}$ harmonic in the above example. Based upon the magnitude and phase of each of the harmonics of interest, the controller 28 controls the inverter switches 22 in any known fashion so as to suppress all but the first harmonic from the output of the inverter 18.

However, it is likely that harmonics having frequencies which are integer multiples of the harmonic frequency of interest will also appear on the DC link 20 of the inverter 18. Therefore, sampling at the frequency of the harmonic of interest produces results which are influenced by any integer multiples of the harmonic of interest if such integer multiples of the harmonic of interest are present in the analyzed signal. For example, let it be assumed that the signal being analyzed has a fundamental frequency f, that $n_1$ is the harmonic number of the harmonic of interest, that $n_2$ is the harmonic number of a harmonic of both the harmonic $n_1$ of interest and the fundamental frequency (i.e., $n_2$ is an integer multiple of $n_1$), that both the harmonic $n_1$ and the harmonic $n_2$ are present in the signal being analyzed, and that no harmonics having a harmonic number greater than $n_2$ are present in the signal being analyzed. If the signal being sampled is sampled at a sampling frequency $n_2 f$, i.e. the frequency of the harmonic $n_2$, and if a sufficient number of the samples are summed, the resulting sum is substantially dependent only upon the harmonic $n_2$ and will not contain any significant portion dependent upon lower order harmonics. That is, because of the periodic nature of harmonics, the portion in each sample resulting from lower order harmonics will sum to zero. Thus, when the samples are summed, the resulting sum is dependent only upon the harmonic $n_2$.

However, if the signal is sampled at a sampling frequency $n_1 f$, i.e. the frequency of the harmonic $n_1$, and if the samples are summed, the sum includes not only a portion dependent upon the harmonic $n_1$ but, also, a portion dependent upon higher order harmonics, such as the harmonic $n_2$. Consequently, if the signal is sampled at the sampling frequency $n_2 f$, if all of the resulting samples are summed to produce a first sum, if a sufficient number of the samples related to the frequency $n_1 f$ of the harmonic $n_1$ are summed to produce a second sum, and if the average of the first sum is subtracted from the average of the second sum, the result is a quantity dependent primarily upon the harmonic $n_1$, and has no significant portion dependent upon the harmonic $n_2$.

Averages are used here for normalization purposes. That is, the number of samples at the $n_2 f$ sampling frequency is necessarily greater than the number of samples at the $n_1 f$ sampling frequency. Therefore, without normalization, the difference between the sum of the $n_2 f$ samples and the sum of the $n_1 f$ samples would be influenced more by the $n_2 f$ samples than by the $n_1 f$ samples. To even out these influences, the sum of the $n_2 f$ samples and the sum of the $n_1 f$ samples are normalized by using the average of the $n_2 f$ samples and the average of the $n_1 f$ samples.

As a specific example, if the 13$^{th}$ harmonic is a harmonic of interest to be suppressed by the proper control of the inverter switches 22, and if it is assumed that the filter 24 adequately eliminates all harmonics above the $50^{th}$ harmonic, then the additional harmonics which might influence the sum of the samples resulting from a sampling frequency equal to the frequency of the $13^{th}$ harmonic are the $26^{th}$ and the $39^{th}$ harmonics. Thus, a sampling frequency equal to the frequency of the $78^{th}$ harmonic is chosen to produce each of the sample sets $A_{mn}$ and $B_{mn}$. Every second sample in the sample set $A_{mn}$ are summed to produce a first sum, i.e. a sum dependent upon the $39^{th}$ harmonic. Every third sample in the sample set are summed to produce a second sum, i.e. a sum dependent upon the $26^{th}$ harmonic. Every sixth sample is used to produce a third sum, i.e. a sum dependent upon the $13^{th}$, $26^{th}$, and the $39^{th}$ harmonics. After normalization (i.e., averaging), the first and second sums are subtracted from the third sum to produce a quantity dependent only upon the $13^{th}$ harmonic. A sampling frequency equal to the $78^{th}$ harmonic is chosen instead of a sampling frequency equal to the $39^{th}$ harmonic because the $26^{th}$ harmonic can be derived from the $78^{th}$ (by summing every third sample) but not from the $39^{th}$ harmonic.

As shown in FIG. 2, the sampler 36 produces a sample set $A_{mn}$ where n is the harmonic number of the harmonic of interest (e.g., $n_1$), and m is an integer multiple of the harmonic of interest and is selected to include one or more multiples of the harmonic of interest which may also appear in the signal being analyzed (e.g., m is selected so that $mn = n_2$). In the example above, n is the harmonic number related to the $13^{th}$ harmonic and m is 6 indicating that the sampling frequency should be the frequency of the $78^{th}$ harmonic. At this sampling frequency, the samples in the sample set $A_{mn}$ include samples of the $13^{th}$, the $26^{th}$, and the $39^{th}$ harmonics. Likewise, the samples included in the sample set $B_{mn}$ include samples of the $13^{th}$, the $26^{th}$, and the $39^{th}$ harmonics.

Averagers 42 . . . 44 average all the appropriate samples of the sample set $A_{mn}$ by summing all of the appropriate samples and dividing by the number of samples in the sum. In the example above, every second sample of the sample set $A_{mn}$ relating to the $39^{th}$ harmonic are averaged, every third sample of the sample set $A_{mn}$ relating to the $26^{th}$ harmonic are averaged, and every sixth sample of the sample set $A_{mn}$ relating to the $13^{th}$ harmonic are averaged. Similarly, averagers 46 . . . 48 average all of the appropriate samples of the sample set $B_{mn}$ by summing all of the appropriate samples and dividing by the number of samples in the sum. Thus, every second sample of the sample set $B_{mn}$ relating to the $39^{th}$ harmonic are averaged, every third sample of the sample set $B_{mn}$ relating to the $26^{th}$ harmonic are averaged, and every sixth sample of the sample set $B_{mn}$ relating to the $13^{th}$ harmonic are averaged.

A subtractor 50 subtracts the appropriate averages produced by the averagers 42 . . . 44 from the average related to the harmonic of interest. Thus, in the example above, the average related to the $39^{th}$ harmonic in the sample set $A_{mn}$ and the average related to the $26^{th}$ harmonic in the sample set $A_{mn}$ are subtracted from the average related to the $13^{th}$ harmonic in the sample set $A_{mn}$. Accordingly, with respect to the first sample set $A_{mn}$, the influence of the harmonics which are integer multiples of the harmonic of interest, i.e. the $26^{th}$ and the $39^{th}$ harmonics in the above example, are removed from the average of the samples related to the harmonic of interest, i.e. the $13^{th}$ harmonic in the above example. What remains is an average of the first sample set $A_{mn}$ dependent only upon the harmonic of interest.

Similarly, a subtractor 52 subtracts the appropriate averages produced by the averagers 46 . . . 48 from the average related to the harmonic of interest. Thus, in the example above, the average related to the $39^{th}$ harmonic in the sample set $B_{mn}$ and the average related to the $26^{th}$ harmonic in the sample set $B_{mn}$ are subtracted from the average related to the $13^{th}$ harmonic in the sample set $B_{mn}$. Accordingly, with respect to the second sample set $B_{mn}$, the influence of the harmonics which are integer multiples of the harmonic of interest, i.e. the $26^{th}$ and the $39^{th}$ harmonics in the above example, are removed from the average of the samples related to the harmonic of interest, i.e. the $13^{th}$ harmonic in the above example. What remains is an average of the second sample set $B_{mn}$ dependent only upon the harmonic of interest.

A square root extractor 54 determines the magnitude of the harmonic of interest according to the following equation:

$$mag_n = \sqrt{a^2 + b^2} \quad (6)$$

where $mag_n$ is the magnitude of the harmonic of interest having the harmonic number n, a is the difference determined by the subtractor 50, and b is the difference determined by the subtractor 52. The quantity $mag_n$ is supplied to the controller 28 shown in FIG. 1 over an output 56 of the square root extractor 54. A trigonometric extractor 58 determines the phase of the harmonic of interest according to the following equation:

$$pha_n = \tan^{-1} \frac{b}{a} \quad (7)$$

where $pha_n$ is the phase of the harmonic of interest having the harmonic number n, a is the difference determined by the subtractor 50, and b is the difference determined by the subtractor 52. The quantity $pha_n$ is supplied to the controller 28 shown in FIG. 1 over an output 60 of the trigonometric extractor 58. With the magnitude and the phase of the harmonic of interest now known, the controller 28 can apply any known control methodology (such as that disclosed in the Kirchberg et al. U.S. Pat. No. 5,053,939) in order to control the inverter switches 22 to eliminate the effect of the harmonic $n_1$ of interest from the output of the inverter switches 22.

Equations (6) and (7) may be used, together with samples taken at the appropriate sampling frequencies, to determine the phase and magnitude of each harmonic to be controlled. Thus, the first harmonic, i.e. the harmonic at the fundamental frequency, may be controlled at a desired phase and magnitude based upon the measured phase and magnitude of the first harmonic as determined by equations (6) and (7), and the other harmonics may be controlled based upon the measured corresponding phases and magnitudes as determined by equations (6) and (7) so that the effects of these other harmonics are suppressed from the output of the inverter switches 22.

In selecting an appropriate sampling frequency for all of the harmonics of interest, the lowest frequency common to all of these harmonies of interest, and to all of the multiples of these harmonics which may be present, is chosen. For example, if only the $11^{th}$ and $13^{th}$ harmonics are of interest (i.e., are to be controlled), and if the filter 24 suppresses all harmonics above the $50^{th}$ harmonic, the $22^{nd}$, $26^{th}$, $33^{rd}$, $39^{th}$, and $44^{th}$ harmonics (i.e., which are integer multiples of the $11^{th}$ and $13^{th}$ harmonics) may also be present, and their effects must be eliminated from the samples of their corresponding harmonics of interest. The lowest frequency common to all of these harmonics is the frequency of the $1716^{th}$ harmonic. Thus, the frequency of the $1716^{th}$ harmonic is chosen as the sampling frequency.

However, it is likely that more harmonics than just the $11^{th}$ and the $13^{th}$ harmonics are to be controlled. As the number of harmonics to be controlled increases, the lowest common harmonic increases dramatically, and may become too high to be practicable. A lower, yet still high, sampling frequency may be chosen such that, although the sampling frequency is not common to all harmonics of interest and their integer multiples, the error associated with using samples that are not at exactly the frequency of one or more of these harmonics is low. Alternatively, separate sampling frequencies may be used for each harmonic to be controlled. Thus, in the example above where the $11^{th}$ and $13^{th}$ harmonics are to be controlled, a sampling frequency of the $132^{th}$ harmonic is used for the $11^{th}$ harmonic because it is common to the $11^{th}$, $26^{nd}$, the $33^{rd}$, and the $44^{th}$ harmonics (i.e., it is common to the harmonic of interest and each of its integer multiples up to the harmonic not filtered by the filter 24), and an additional sampling frequency of the $78^{th}$ harmonic is used for the $13^{th}$ harmonic because it is common to the $13^{th}$, the $26^{th}$, and the $39^{th}$ harmonics (i.e., it is common to the harmonic of interest and each of its integer multiples up to the harmonic not filtered by the filter 24).

While it may be desirable to control the inverter switches 22 so as to eliminate a large number of harmonics, many control methodologies do not permit the control of a large number of harmonics. Thus, it may be possible to suppress the $13^{th}$ harmonic but not the $26^{th}$ and $39^{th}$ harmonics even though samples related to these harmonics have been obtained. For example, in the system disclosed by Kirchberg, et al. in the U.S. Pat. No. 4,994,956, the switching angles of PWM pulses produced by the inverter switches of an inverter are adjusted in accordance with the measured harmonics in order to control the harmonic content in the output of the inverter. Because the number of switching angles are finite, the number of harmonics which can be so controlled is also finite. Thus, while it may be desirable to control the harmonic $n_1$, e.g. the $13^{th}$ harmonic, and its integer multiples $n_2$, $n_3$, . . . , e.g. the $26^{th}$ and $39^{th}$ harmonics, it may only be practicable to control the harmonic $n_1$, e.g. the $13^{th}$ harmonic, and it may not be practicable to control its integer multiples $n_2$, $n_3$, . . . , e.g. the $26^{th}$ and $39^{th}$ harmonics.

As indicated above, the samplers 36 and 38 sample at a sampling frequency which is high enough to include not only the harmonic of interest but also any integer multiples of the harmonic of interest if those integer multiples of the harmonic of interest may appear in the signal being analyzed. There should be a sufficient number of averagers to average all of the relevant sets of samples in the $A_{mn}$ set of samples. The number of averagers depends upon the number of harmonics of interest and the number of integer multiples which may be present. For example, if the harmonic $n_1$ of interest is the $7^{th}$ harmonic of the inverter fundamental frequency, the harmonics which are integer multiples of the $7^{th}$ harmonic, i.e. the $14^{th}$ harmonic, the $21^{st}$ harmonic, the $28^{th}$ harmonic, the $35^{th}$ harmonic, the $42^{nd}$ harmonic, and the $49^{th}$ harmonic may also be present in the signal, it being understood, as discussed above, that the filter 24 adequately suppresses all harmonics above the $50^{th}$ harmonic. Accordingly, the samplers 36 and 38 should be arranged to sample the output of the bandpass filter 30 at a sampling frequency high enough to include samples for each of these harmonics. A sufficient number of averagers are necessary to average all samples in the sample set $A_{mn}$ related to each of these harmonics. Similarly, there should be a sufficient number of averagers to average all samples in the relevant sets of samples in the $B_{mn}$ set of samples.

Figure 4:
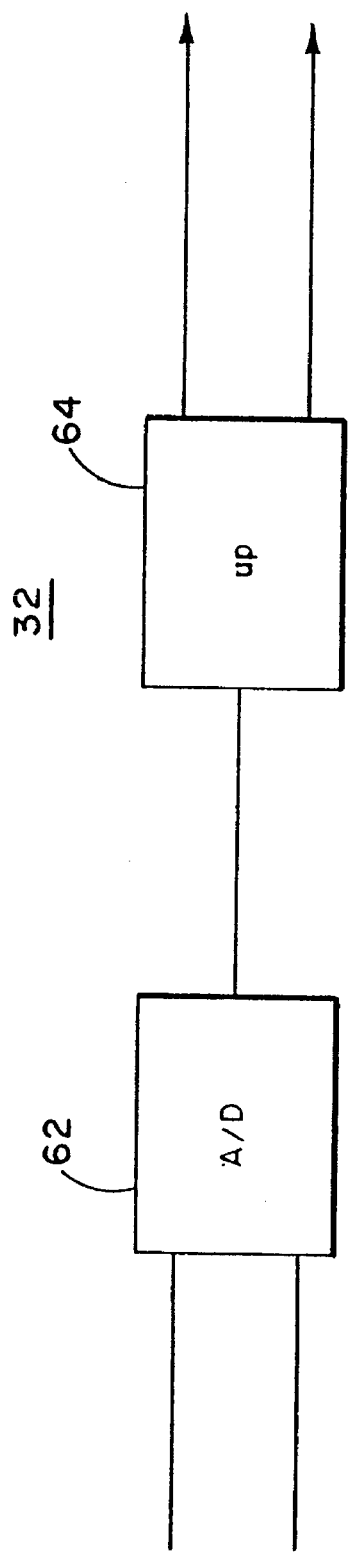
FIG. 4 is a block diagram showing another embodiment of the present invention; and, FIG. 5 is a flow chart of a program which can be used with the microprocessor shown in FIG. 4.

FIG. 4 shows another embodiment for the analyzer 32 shown in FIG. 1. In the embodiment shown in FIG. 4, the analyzer 32' includes an analog to digital (A-to-D) converter 62 which converts the output from the bandpass filter 30 to a digital signal. A microprocessor 64 samples the digital signal from the A-to-D converter 62 and determines the magnitude and phase of the harmonic components of the signal on the DC link 20. The microprocessor 64 operates according to the flow chart shown in FIG. 5.

Figure 5:
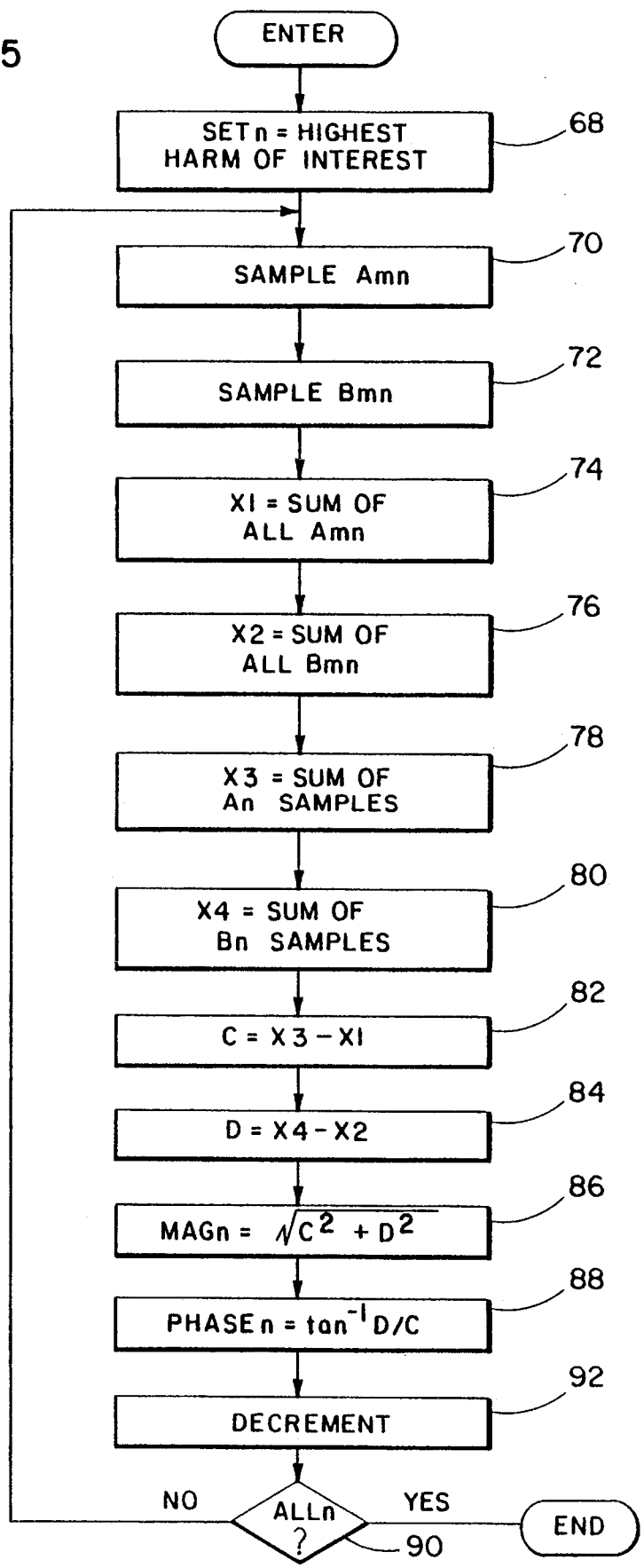

When the program 66 shown in FIG. 5 is entered, a block 68 first sets a variable n to the frequency of the highest order harmonic to be controlled. A block 70 samples the output from the A-to-D converter 62 at a sampling frequency mnf where n is set by the block 68, m is an integer selected so that the sampling frequency produces samples of the harmonic n and each of the integer multiples of the harmonic n which may be present in the digital signal from the A-to-D converter 62, and f is the fundamental frequency of the inverter 18. Thus, the sampling frequency mnf is the lowest frequency common to the harmonic n and each of the integer multiples of the harmonic n which may be present. For example, if n=13 to indicate the $13^{th}$ harmonic, and if the $39^{th}$ harmonic is the highest order harmonic multiple of the $13^{th}$ harmonic which may be present in the digital signal from the A-to-D converter 62, then m is set to a value of 6. The block 70 accordingly produces a sample set $A_{mn}$.

A block 72 then samples, at the same sampling frequency, the output of the A-to-D converter 62 to produce a second sample set $B_{mn}$, wherein each sample of the sample set $B_{mn}$ is displaced in phase by 90° from a corresponding sample in the sample set $A_{mn}$. A block 74 determines the averages of the samples relating to each of the integer multiples of the harmonic n in the sample set $A_{mn}$ and sums these averages, and a block 76 determines the averages of the samples relating to each of the integer multiples of the harmonic n in the sample set $B_{mn}$ and sums these averages. A block 78 determines the average of the samples relating to the harmonic n, and a block 80 determines the average of the samples relating to the harmonic n in the sample set $B_{mn}$.

A block 82 subtracts the sum produced by the block 74 from the average produced by the block 78. Similarly, a block 84 subtracts the sum produced by the block 76 from the average produced by the block 80. A block 86 determines the magnitude of the harmonic n of interest by extracting the square root of the sum of the squares of the differences determined by the blocks 82 and 84 and sends that magnitude to the controller 28. A block 88 determines the phase of the harmonic n of interest by extracting the arc tangent of the difference determined by the block 84 divided by the difference determined by the block 82 and sends that phase to the controller 28.

A block 90 decrements n to the harmonic number of the next lower harmonic to be controlled. A block 92 then determines whether the magnitude and phase of all harmonics to be controlled have been determined. If not, the magnitude and phase of the next harmonic of interest are determined by the blocks 70–88. When all harmonics of interest have been processed, the program ends.

Rather than starting over with a complete new set of samples each time the harmonics in the inverter signal are to be determined, the analyzer 32/32' may add the newest pair of samples (or a predetermined number of pairs of samples) to the corresponding sample sets $A_{mn}$ and $B_{mn}$, drop out the oldest pair of samples (or the oldest predetermined number of pairs of samples), and recompute the magnitude and phase of each harmonic to be controlled during each pass through the program of FIG. 5.

Furthermore, the analyzer 32 is shown in FIG. 1 as analyzing an inverter signal in the form of the DC power on the DC link 20, i.e. the analyzer 32 is shown analyzing the output from the bandpass filter 30 which is connected to the DC link 20. Alternatively, the inverter signal may be the constant frequency AC power at a POR (Point of Reference) 94 (FIG. 1) between the filter 24 and the AC loads 26. In this case, a bandpass filter would not be necessary; however, each phase of the inverter 18 output must be analyzed. Accordingly, instead of determining the harmonics in the output of the inverter 18 based upon a single analysis of the harmonics on the DC link 20, three analyses are required to analyze directly the harmonics in the output of the inverter 18. Thus, while analyzing the AC power at the POR 94 provides a more direct measure of the harmonic content in the AC power being supplied to the AC loads 26, the signal processing power is tripled.

Various other modifications and adaptations may be made by those skilled in the art without departing from the scope and spirit of the invention. Therefore, the present invention is to limited only by the following claims.

We claim:

1. An apparatus for determining a frequency component of a signal comprising:

sampling means for sampling the signal at a sampling frequency, wherein the sampling means produces first and second sets of samples at the sampling frequency, and wherein corresponding samples of the first and second sets of samples are separated in phase by substantially 90°; and, frequency component determining means for determining the frequency component of the signal from the first and second sets of samples.

2. The apparatus of claim 1 wherein the frequency component determining means comprises phase and magnitude determining means for determining phase and magnitude of the frequency component from the first and second sets of samples.

3. The apparatus of claim 2 wherein the phase and magnitude determining means comprises first sample summing means for summing the first set of samples to determine a first sum, second sample summing means for summing the second set of samples to determine a second sum, and means for determining the magnitude and phase of the frequency component based upon the first and second sums.

4. The apparatus of claim 3 wherein the phase and magnitude determining means comprises magnitude determining means for determining the magnitude of the frequency component according to the following equation:

$$mag = \sqrt{a^2 + b^2}$$

where mag is the magnitude of the frequency component, a is based upon the first sum, and b is based upon the second sum, and wherein the phase and magnitude determining means further comprises phase determining means for determining the phase of the frequency component according to the following equation:

$$pha = \tan^{-1}\frac{b}{a}$$

where pha is the phase of the frequency component, a is based upon the first sum, and b is based upon the second sum.

5. The apparatus of claim 2 wherein the phase and magnitude determining means comprises magnitude determining means for determining the magnitude of the frequency component according to the following equation:

$$mag = \sqrt{a^2 + b^2}$$

where mag is the magnitude of the frequency component, a is a normalized value relating to the first set of samples, and b is a normalized value relating to the second set of samples, and wherein the phase and magnitude determining means further comprises phase determining means for determining the phase of the frequency component according to the following equation:

$$pha = \tan^{-1}\frac{b}{a}$$

where pha is the phase of the frequency component, a is a normalized value relating to the first set of samples, and b is a normalized value relating to the second set of samples.

6. An apparatus for determining a first harmonic component of a signal, wherein the signal has a fundamental frequency f, wherein the first harmonic component has a frequency $n_1 f$, wherein $n_1$ is an integer, wherein the signal has a second harmonic component, wherein the second harmonic component has a frequency $n_2 f$, and wherein $n_2$ is an integer multiple of $n_1$, the apparatus comprising:

sampling means for sampling the signal at a sampling frequency $n_3 f$, wherein the sampling means produces first and second sets of samples at the sampling frequency $n_3 f$, wherein $n_3$ is an integer multiple of $n_1$, and wherein corresponding samples in the first and second sets of samples are separated in phase by substantially 90°; and, harmonic component determining means for determining the first harmonic component from the first and second sets of samples.

7. The apparatus of claim 6 wherein the harmonic component determining means comprises phase and magnitude determining means for determining phase and magnitude of the first harmonic component based upon the first and second sets of samples.

8. The apparatus of claim 7 wherein the phase and magnitude determining means comprises first sample summing means for summing samples of the first set of samples related to the frequency $n_1 f$ to determine a first sum, second sample summing means for summing samples of the first set of samples related to the frequency $n_2 f$ to determine a second sum, third sample summing means for summing samples of the second set of samples related to the frequency $n_1 f$ to determine a third sum, fourth sample summing means for summing samples of the second set of samples related to the frequency $n_2 f$ to determine a fourth sum, and means for determining the magnitude and phase of the first harmonic component based upon the first, second, third, and fourth sums.

9. The apparatus of claim 8 wherein the phase and magnitude determining means comprises magnitude determining means for determining the magnitude of the first harmonic component according to the following equation:

$$mag_{n1} = \sqrt{a^2 + b^2}$$

where $mag_{n1}$ is the magnitude of the first harmonic component, a is related to the first sum less the second sum, and b is related to the third sum less the fourth sum, and wherein the phase and magnitude determining means further comprises phase determining means for determining the phase of the first harmonic component according to the following equation:

$$pha_{n1} = \tan^{-1} \frac{b}{a}$$

where $pha_{n1}$ is the phase of the first harmonic component, a is related to the first sum less the second sum, and b is related to the third sum less the fourth sum.

10. The apparatus of claim 7 wherein the phase and magnitude determining means comprises magnitude determining means for determining the magnitude of the first harmonic component according to the following equation:

$$mag_{n1} = \sqrt{a^2 + b^2}$$

where $mag_{n1}$ is the magnitude of the first harmonic component, a is an average of the samples in the first set of samples related to the frequency $n_1f$ less an average of the samples in the first set of samples related to the frequency $n_2f$, and b is an average of the samples in the second set of samples related to the frequency $n_1f$ less an average of the samples in the second set of samples related to the frequency $n_2f$, and wherein the phase and magnitude determining means further comprises phase determining means for determining the phase of the first harmonic component according to the following equation:

$$pha_{n1} = \tan^{-1} \frac{b}{a}$$

where $pha_{n1}$ is the phase of the first harmonic component, a is an average of the samples in the first set of samples related to the frequency $n_1f$ less an average of the samples in the first set of samples related to the frequency $n_2f$, and b is an average of the samples in the second set of samples related to the frequency $n_1f$ less an average of the samples in the second set of samples related to the frequency $n_2f$.

11. The apparatus of claim 6 wherein $n_3$ is an integer multiple of $n_2$ and wherein $n_2$ and $n_3$ are unequal.

12. An inverter system comprising:
 an inverter having a DC receiving means for receiving input DC power and AC providing means for providing output AC power having a fundamental frequency f;
 harmonic determining means connected to the inverter for sampling a signal of the inverter at a sampling frequency $n_2f$ to produce first and second sets of samples and for determining a harmonic of the fundamental frequency f from the first and second sets of samples, wherein the harmonic has a frequency $n_1f$, wherein corresponding samples in the first and second sets of samples are separated in phase by substantially 90°, wherein $n_2$ is an integer greater than $n_1$, and wherein the frequency $n_2f$ is another harmonic of the fundamental frequency f; and,
 controlling means connected to the inverter and to the harmonic determining means for controlling the inverter so as to suppress the harmonic having the frequency $n_1f$.

13. The apparatus of claim 12 wherein the harmonic determining means determines phase and magnitude of the harmonic having the frequency $n_1f$ from the first and second sets of samples.

14. The apparatus of claim 13 wherein the harmonic determining means sums the samples of the first set of samples related to the frequency $n_1f$ to determine a first sum, sums the samples of the first set of samples related to a frequency of a harmonic which is an integer multiple of the harmonic having frequency $n_1f$ to determine a second sum, sums the samples of the second set of samples related to the frequency $n_1f$ to determine a third sum, sums the samples of the second set of samples related to the frequency of the harmonic which is an integer multiple of the harmonic having frequency $n_1f$ to determine a fourth sum, and determines the magnitude and phase of the harmonic having the frequency $n_1f$ based upon the first, second, third, and fourth sums.

15. The apparatus of claim 14 wherein the harmonic determining means determines the magnitude of the harmonic having the frequency $n_1f$ according to the following equation:

$$mag_{n1} = \sqrt{a^2 + b^2}$$

where $mag_{n1}$ is the magnitude of the harmonic having the frequency $n_1f$, a is related to the first sum less the second sum, and b is related to the third sum less the fourth sum, and determines the phase of the harmonic having the frequency $n_1f$ according to the following equation:

$$pha_{n1} = \tan^{-1} \frac{b}{a}$$

where $pha_{n1}$ is the phase of the harmonic having the frequency $n_1f$, a is related to the first sum less the second sum, and b is related to the third sum less the fourth sum.

16. The apparatus of claim 13 wherein the harmonic determining means determines the magnitude of the harmonic having the frequency $n_1f$ according to the following equation:

$$mag_{n1} = \sqrt{a^2 + b^2}$$

where $mag_{n1}$ is the magnitude of the harmonic having the frequency $n_1f$, a is an average of the samples in the first set of samples related to the frequency $n_1f$ less an average of the samples in the first set of samples related to a harmonic which is an integer multiple of the harmonic having the frequency $n_1f$, and b is an average of the samples in the second set of samples related to the frequency $n_1f$ less an average of the samples in the second set of samples related to the harmonic which is an integer multiple of the harmonic having the frequency $n_1f$, and wherein the harmonic determining means further determines the phase of the harmonic having the frequency $n_1f$ according to the following equation:

$$pha_{n1} = \tan^{-1} \frac{b}{a}$$

where $pha_{n1}$ is the magnitude of the harmonic having the frequency $n_1f$, a is an average of the samples in the first set of samples related to the frequency $n_1f$ less an average of the samples in the first set of samples related to the harmonic which is an integer multiple of the harmonic having the frequency $n_1f$, and b is an average of the samples in the second set of samples related to the frequency nf less an average of the samples in the second set of samples related to the harmonic which is an integer multiple of the harmonic having the $n_1f$.

17. An inverter system comprising:
 an inverter having a DC receiving means for receiving input DC power and AC providing means for providing output AC power having a fundamental frequency f;

harmonic determining means connected to the inverter for sampling a signal of the inverter at a sampling frequency to produce first and second sets of samples and for determining a harmonic of the fundamental frequency f from the first and second sets of samples, wherein the harmonic has a frequency $n_1f$, and, controlling means connected to the inverter and to the harmonic determining means for controlling the inverter so as to suppress the harmonic having the frequency $n_1f$.

18. The apparatus of claim 17 wherein the harmonic determining means comprises phase and magnitude determining means for determining phase and magnitude of the harmonic having the frequency $n_1f$ from the first and second sets of samples.

19. The apparatus of claim 18 wherein the phase and magnitude determining means comprises first sample summing means for summing the samples of the first set of samples related to the frequency $n_1f$ to determine a first sum, second sample summing means for summing the samples of the first set of samples related to a frequency $n_2f$ to determine a second sum, wherein $n_2$ is an integer multiple of $n_1$, third sample summing means for summing the samples of the second set of samples related to the frequency $n_1f$ to determine a third sum, fourth sample summing means for summing the samples of the second set of samples related to the frequency $n_2f$ to determine a fourth sum, and means for determining the magnitude and phase of the harmonic having the frequency $n_1f$ based upon the first, second, third, and fourth sums.

20. The apparatus of claim 19 wherein the phase and magnitude determining means comprises magnitude determining means for determining the magnitude of the harmonic having the frequency $n_1f$ according to the following equation:

$$mag_{n1} = \sqrt{a^2 + b^2}$$

where $mag_{n1}$ is the magnitude of the harmonic having the frequency $n_1f$, a is related to the first sum less the second sum, and b is related to the third sum less the fourth sum, and wherein the phase and magnitude determining means further comprises phase determining means for determining the phase of the harmonic having the frequency $n_1f$ according to the following equation:

$$pha_{n1} = \tan^{-1}\frac{b}{a}$$

$pha_{n1}$ is the phase of the harmonic having the frequency $n_1f$, a is related to the first sum less the second sum, and b is related to the third sum less the fourth sum.

21. The apparatus of claim 18 wherein $n_2$ is an integer multiple of $n_1$, wherein the phase and magnitude determining means comprises magnitude determining means for determining the magnitude of the harmonic having the frequency $n_1f$ according to the following equation:

$$mag_{n1} = \sqrt{a^2 + b^2}$$

where $mag_{n1}$ is the magnitude of the harmonic having the frequency $n_1f$, a is an average of the samples in the first set of samples related to the frequency $n_1f$ less an average of the samples in the first set of samples related to a frequency $n_2f$, and b is an average of the samples in the second set of samples related to the frequency $n_1f$ less an average of the samples in the second set of samples related to the frequency $n_2f$, and wherein the phase and magnitude determining means further comprises phase determining means for determining the phase of the harmonic having the frequency $n_1f$ according to the following equation:

$$pha_{n1} = \tan^{-1}\frac{b}{a}$$

where $pha_{n1}$ is the phase of the harmonic having the frequency $n_1f$, a is an average of the samples in the first set of samples related to the frequency $n_1f$ less an average of the samples in the first set of samples related to the frequency $n_2f$, and b is an average of the samples in the second set of samples related to the frequency $n_1f$ less an average of the samples in the second set of samples related to the frequency $n_2f$.

22. A method for determining a component in a signal, wherein the signal has a fundamental frequency f, and wherein the component has a frequency $n_1f$ which is substantially an integer multiple of the fundamental frequency f, the method comprising to following steps:

sampling the signal at a sampling frequency to produce first and second sets of samples, wherein corresponding samples in the first and second sets of samples are separated in phase by substantially 90°; and, determining the component from the first and second sets of samples.

23. The method of claim 22 wherein the step of sampling the signal comprises the step of determining phase and magnitude of the component from the first and second sets of samples.

24. The method of claim 23 wherein a frequency $n_2f$ is substantially an integer multiple of the frequency $n_1f$, wherein the step of determining phase and magnitude comprises the steps of summing samples of the first set of samples related to the frequency $n_1f$ to determine a first sum, summing samples of the first set of samples related to the frequency $n_2f$ to determine a second sum, summing samples of the second set of samples related to the frequency $n_1f$ to determine a third sum, summing samples of the second set of samples related to the frequency $n_2f$ to determine a fourth sum, and determining the magnitude and phase of the component based upon the first, second, third, and fourth sums.

25. The method of claim 24 wherein the step of determining phase and magnitude comprises the further steps of determining the magnitude of the component according to the following equation:

$$mag = \sqrt{a^2 + b^2}$$

where mag is the magnitude of the component, a is related to the first sum less the second sum, and b is related to the third sum less the fourth sum, and determining the phase of the component according to the following equation:

$$pha = \tan^{-1}\frac{b}{a}$$

where pha is the phase of the component, a is related to the first sum less the second sum, and b is related to the third sum less the fourth sum.

26. The method of claim 23 wherein a frequency $n_2f$ is substantially an integer multiple of the frequency $n_1f$, wherein the step of determining phase and magnitude comprises the further steps of determining the magnitude of the component according to the following equation:

$$mag = \sqrt{a^2 + b^2}$$

where mag is the magnitude of the component, a is an average of the samples in the first set of samples related to the frequency $n_1 f$ less an average of the samples in the first set of samples related to the frequency $n_2 f$, and b is an average of the samples in the second set of samples related to the frequency $n_1 f$ less an average of the samples in the second set of samples related to the frequency $n_2 f$, and determining the phase of the component according to the following equation:

$$pha = \tan^{-1} \frac{b}{a}$$

where pha is the phase of the component, a is an average of the samples in the first set of samples related to the frequency $n_1 f$ less an average of the samples in the first set of samples related to the frequency $n_2 f$, and b is an average of the samples in the second set of samples related to the frequency $n_1 f$ less an average of the samples in the second set of samples related to the frequency $n_2 f$.

* * * * *